United States Patent [19]

Wu

[11] Patent Number: 5,482,872
[45] Date of Patent: Jan. 9, 1996

[54] METHOD OF FORMING ISOLATION REGION IN A COMPOUND SEMICONDUCTOR SUBSTRATE

[75] Inventor: Schyi-yi Wu, Mesa, Ariz.

[73] Assignee: Motorola, Inc., Schaumburg, Ill.

[21] Appl. No.: 188,985

[22] Filed: Jan. 31, 1994

[51] Int. Cl.$^6$ ............................................. H01L 21/266
[52] U.S. Cl. ........................ 437/22; 437/24; 437/184; 437/185; 437/41
[58] Field of Search ........................ 437/24, 41, 912, 437/22, 184, 185; 257/280, 284

[56] References Cited

U.S. PATENT DOCUMENTS

| | | | |
|---|---|---|---|
| 4,523,961 | 6/1985 | Hartman et al. | 148/1.5 |
| 4,539,743 | 9/1985 | Anthony et al. | 29/576 B |
| 4,546,540 | 10/1985 | Ueyonogi et al. | 29/579 |
| 4,662,060 | 5/1987 | Aina et al. | 437/22 |
| 4,704,784 | 11/1987 | Sydlo et al. | 437/41 |
| 4,771,324 | 9/1988 | Odani et al. | 257/195 |
| 4,818,721 | 4/1989 | Wang | 437/22 |
| 4,924,285 | 5/1990 | Anderson et al. | 257/293 |
| 4,960,718 | 10/1990 | Aina | 437/22 |
| 4,968,637 | 11/1990 | Mozzi et al. | 437/924 |
| 5,060,031 | 10/1991 | Abrokwah et al. | 257/274 |

FOREIGN PATENT DOCUMENTS

| | | | |
|---|---|---|---|
| 1119071 | 5/1989 | Japan | 257/280 |

OTHER PUBLICATIONS

S. Wolf, "*Silicon Processing*" vol. I, 1986, Lattic Press pp. 323, 327.

Primary Examiner—George Fourson
Assistant Examiner—Thomas G. Bilodeau
Attorney, Agent, or Firm—Rennie William Dover

[57] ABSTRACT

Compound semiconductor devices (10, 11) having isolation regions (37) under gate pads (24, 27) and a method of forming the compound semiconductor devices (10, 11). A surface protection layer (33) is formed on a compound semiconductor substrate (31). The surface protection layer (33) is patterned to form a plurality of islands (34). A field oxide (28) is formed on the regions of the compound semiconductor substrate (31) adjacent the plurality of islands (34) and surrounds active device regions (12, 13). Isolation regions (37) are formed around active device regions (12, 13). Control electrodes (21, 22) are formed in contact with the active device regions (12, 13) and extend over the field oxide (28). Source/drain regions (16, 17) are formed adjacent the control electrodes (21, 22). Source/drain electrodes (18, 19) are formed in contact with the source/drain regions (16, 17), thereby forming field effect transistors.

10 Claims, 6 Drawing Sheets

METHOD OF FORMING ISOLATION REGION IN A COMPOUND SEMICONDUCTOR SUBSTRATE

FIELD OF THE INVENTION

The present invention relates, in general, to isolation regions in a semiconductor substrate, and more particularly, to isolation regions in a compound semiconductor substrate and methods of forming the isolation regions.

BACKGROUND OF THE INVENTION

Generally, semiconductor device manufacturers fabricate many semiconductor devices within a single semiconductor substrate. Thus, a variety of techniques have been developed to electrically isolate one semiconductor device from another semiconductor device in the semiconductor substrate. For example, semiconductor devices manufactured in compound semiconductor substrates have used oxygen ion ($O^+$) implants to make regions between active device regions electrically nonconductive. An important aspect in the isolation of compound semiconductor devices is the sequence of the semiconductor device fabrication steps. More particularly, fabrication steps using a self-aligned source/drain implant include forming a gate electrode in an active device region wherein the gate electrode extends over a field oxide to form a gate pad. Subsequently, a dopant is implanted into the active region to form the source/drain regions, followed by an anneal at a temperature of approximately 850° C. Then, isolation regions are formed in the compound semiconductor substrate by implanting oxygen ions ($O^+$) through the portions of the field oxide not covered by the gate electrode material and annealing the semiconductor substrate at a temperature of approximately 550° C. Thus, conductive regions are implanted with oxygen ions and become non-conductive, thereby forming isolation regions.

A drawback of this technique is that the oxygen isolation implant must occur after the formation of the gate electrode to preclude degradation of the effectiveness of the isolation implant by the 850° C. source/drain implant anneal. Since the region of the substrate under the gate electrode material in the field oxide region is not implanted with oxygen ions, it remains conductive. Thus, a capacitance is present between the gate pad and the substrate which degrades circuit speed and increases power consumption. In addition, connecting gates of different devices with a gate electrode material that is over the field oxide may result in semiconductor devices becoming shorted via the conductive region of the substrate under the gate electrode material. Another drawback is that separate anneals are required for the source/drain implant and for the isolation implant.

Accordingly, it would be advantageous to have a method of isolating regions in a compound semiconductor device that decreases a gate pad capacitance, reduces leakage currents, and reduces the number of processing steps required for fabricating the compound semiconductor device.

DETAILED DESCRIPTION OF THE DRAWINGS

Generally, the present invention provides a method for electrically isolating monolithically integrated semiconductor devices in a compound semiconductor substrate from each other. The method of the present invention includes performing an isolation implant of, for example, oxygen ions ($O^+$) prior to the formation of the gate electrodes and performing a single anneal step for both the isolation and the source/drain implants. Further, compound semiconductor devices having isolation regions fabricated in accordance with the present invention include isolation below the gate pads of the semiconductor devices.

Figure 1:
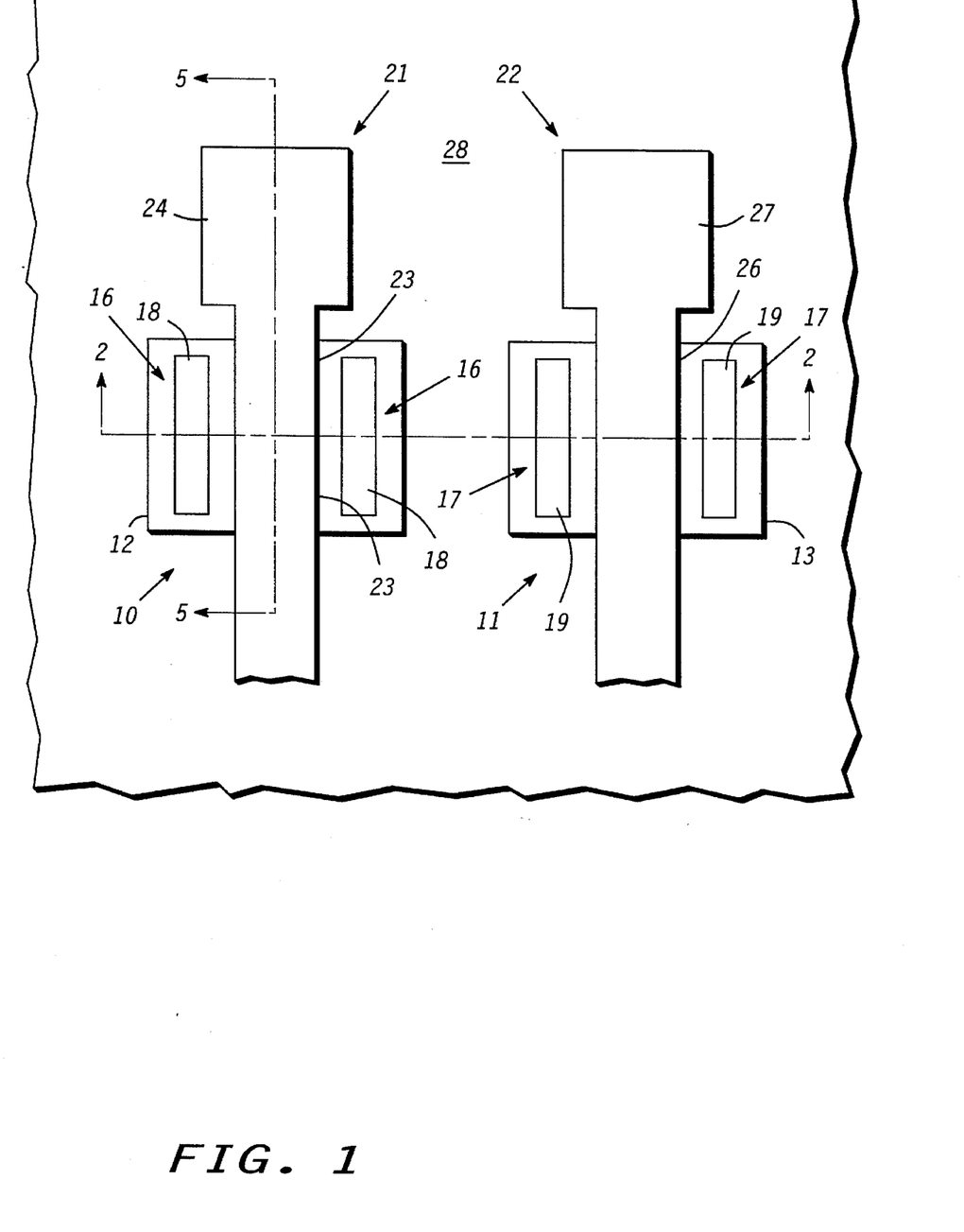
FIG. 1 illustrates a plan view of portions of a plurality of semiconductor devices in accordance with a first embodiment of the present invention.

FIG. 1 illustrates a plan view of portions of semiconductor devices 10 and 11 in accordance with a first embodiment of the present invention. Semiconductor devices 10 and 11 have active areas or regions 12 and 13, respectively, in which the active portions of semiconductor devices 10 and 11 are fabricated. Semiconductor device 10 is a field effect transistor (FET) and has source/drain regions 16, whereas semiconductor device 11 is also a FET and has source/drain regions 17. As those skilled in the art are aware, the source and drain regions of a field effect transistor are interchangeable, thus the regions are typically referred to as source/drain regions. Source/drain regions 16 and 17 are contacted by source/drain electrodes 18 and 19, respectively.

In addition, portions of control electrodes 21 and 22 are illustrated as being between and spaced apart from source/drain electrodes 18 and 19, respectively. More particularly, control electrode 21 is comprised of a first portion 23 and a second portion 24. Likewise, control electrode 22 is comprised of first and second portions 26 and 27, respectively. In the first embodiment, first portions 23 and 26 are over active areas 12 and 13, respectively, and second portions 24 and 27 are over portions of a field oxide 28. Control electrodes 21 and 22 serve as gate electrodes for FET's 10 and 11, and second portions 24 and 27 serve as gate contact pads. A particular advantage of the isolation regions of the present invention over those of the prior art is that gate contact pads 24 and 27 of the present invention are electrically isolated from a semiconductor substrate.

Figure 2:
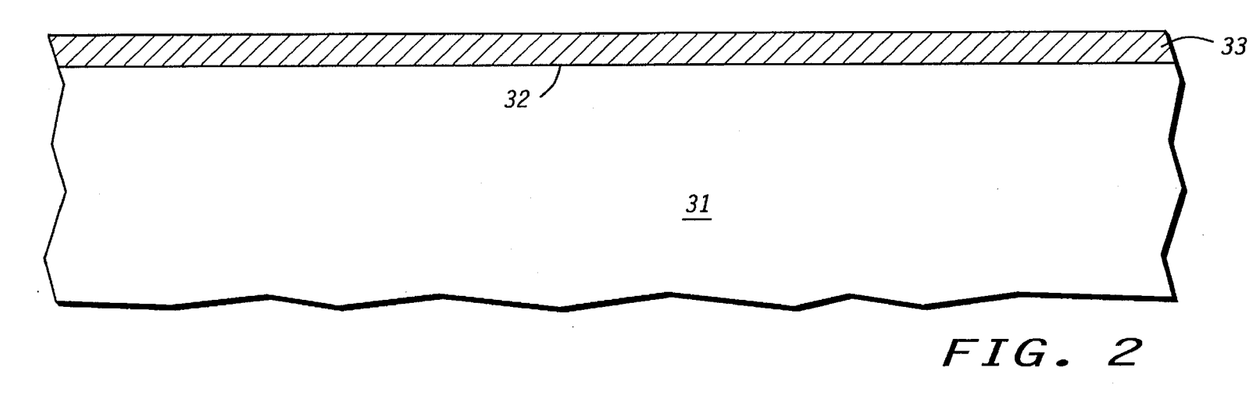
FIGS. 2–4 illustrates highly enlarged cross-sectional views of the semiconductor devices taken along section line 2—2 of FIG. 1 during various processing steps in accordance with the first embodiment of the present invention.

FIG. 2 illustrates a highly enlarged cross-sectional view of portions of semiconductor devices 10 and 11 during a processing step in accordance with the first embodiment of the present invention. The cross-sectional view of FIG. 2 is taken along section line 2—2 of FIG. 1. It shall be understood that the same reference numerals are used in the figures to denote the same elements. A compound semiconductor substrate 31 having a major surface 32 is provided. In the first embodiment, compound semiconductor substrate 31 is a III-V semiconductor substrate. Suitable materials for compound semiconductor substrate 31 include gallium arsenide (GaAs), indium phosphide (InP), aluminum gallium arsenide ($Al_xGa_{(1-x)}As$), indium gallium arsenide ($In_xGa_{(1-x)}As$), or a combination thereof. As those skilled in the art are aware, "x" is a number between zero and one. Semiconductor substrate 31 is covered with a surface protection material which serves as a surface protection layer 33. By way of example, surface protection layer 33 is titanium-tungsten-nitride (TiWN), and portions of surface protection layer 33 serve as first portions 23 and 26 of control electrodes 21 and 22, respectively, of FIG. 1.

Figure 3:
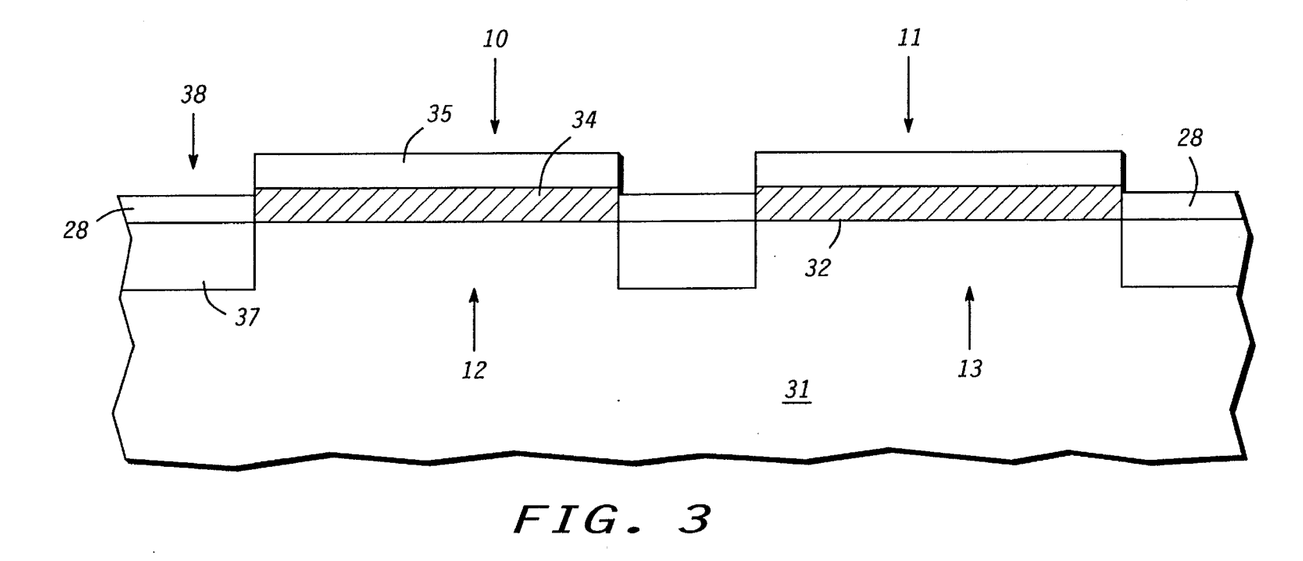

FIG. 3 illustrates a highly enlarged cross-sectional view of the portions of semiconductor devices 10 and 11 further along in processing. Surface protection layer 33 is patterned using photolithographic and etch techniques well known to those skilled in the art to form a plurality of islands 34 and to expose portions of major surface 32. It shall be understood that surface protection layer 33 is removed from all areas of major surface 32 except over active areas 12 and 13, and that the plurality of islands 34 are metal. In addition to forming the plurality of islands 34, trenches 38 are formed between adjacent islands 34. The remaining portions of surface protection layer 33 shall be referred to as the plurality of islands 34 through the remainder of the description of the first embodiment.

A layer of insulating material 28 is conformally deposited over semiconductor substrate 31. Insulating material 28 covers the plurality of islands 34 and the exposed portions of major surface 32. As those skilled in the art are aware, layer of insulating material 28 is not planar. Accordingly, a planarization photoresist (not shown) is formed on layer of insulating material 28 using a planarization method well known to those skilled in the art. The planarization photoresist has a substantially planar photoresist surface. The planarization photoresist is etched back to the surface of layer of insulating material 28 on top of the plurality of islands 34. Thus, the planarization photoresist is removed from layer of insulating material 28 on the plurality of islands 34 but remains on layer of insulating material 28 on the portions of major surface 32 that were exposed when forming the plurality of islands 34. In particular, the surface of layer of insulating material 28 on the plurality of islands 34 and the surface of planarization photoresist remaining elsewhere are at about the same height. Using techniques well known to those skilled in the art the portions of layer of insulating material 28 on the plurality of islands 34 and the remaining portions of the layer of planarization photoresist are removed at the same rate, resulting in the exposure of the plurality of islands 34 and insulating material 28 on major surface 32. By way of example, insulating material 28 on major surface 32 is oxide having a thickness of approximately 5000 angstroms, and is typically referred to as field oxide. It shall be understood that the surface of field oxide 28 is slightly lower than the surface of the plurality of islands 34.

An isolation implant mask layer 35 such as, for example, photoresist is formed on the plurality of islands 34 using photolithographic techniques well known to those skilled in the art. Isolation regions 37 are formed by implanting an ion selected from the group consisting of oxygen, boron, aluminum, nitrogen, and carbon into non-active device regions of compound semiconductor substrate 31. Preferably, isolation regions 37 surround active areas 12 and 13 and extend from major surface 32 into compound semiconductor substrate 31 a first distance. By way of example, isolation regions 37 are formed by implanting oxygen ions ($O^+$) through field oxide 28. Subsequently, isolation implant mask layer 35 is removed. In a preferred embodiment, oxygen ions ($O^+$) are implanted in a three step process. In the first step, oxygen ions ($O^+$) are implanted at an energy of approximately 90 kilo-electron volts (KeV) and a dose of approximately $2\times10^{14}$ ions per centimeter squared ($cm^2$); in a second step the oxygen ions are implanted at an energy of approximately 180 KeV and a dose of approximately $2\times10^{14}$ ions/$cm^2$; and in the third step oxygen ions are implanted at an energy of approximately 360 KeV and a dose of approximately $2\times10^{14}$ ions/$cm^2$. Using this dose and energy regime, the oxygen ions withstand subsequent source/drain anneals of, for example, approximately 850° C. for approximately 6 seconds. Although a dose of approximately $2\times10^{14}$ ions/$cm^2$ has been specified, it shall be understood that a suitable range of doses is between approximately $1\times10^{14}$ ions/$cm^2$ and $1\times10^{15}$ ions/$cm^2$.

Figure 4:
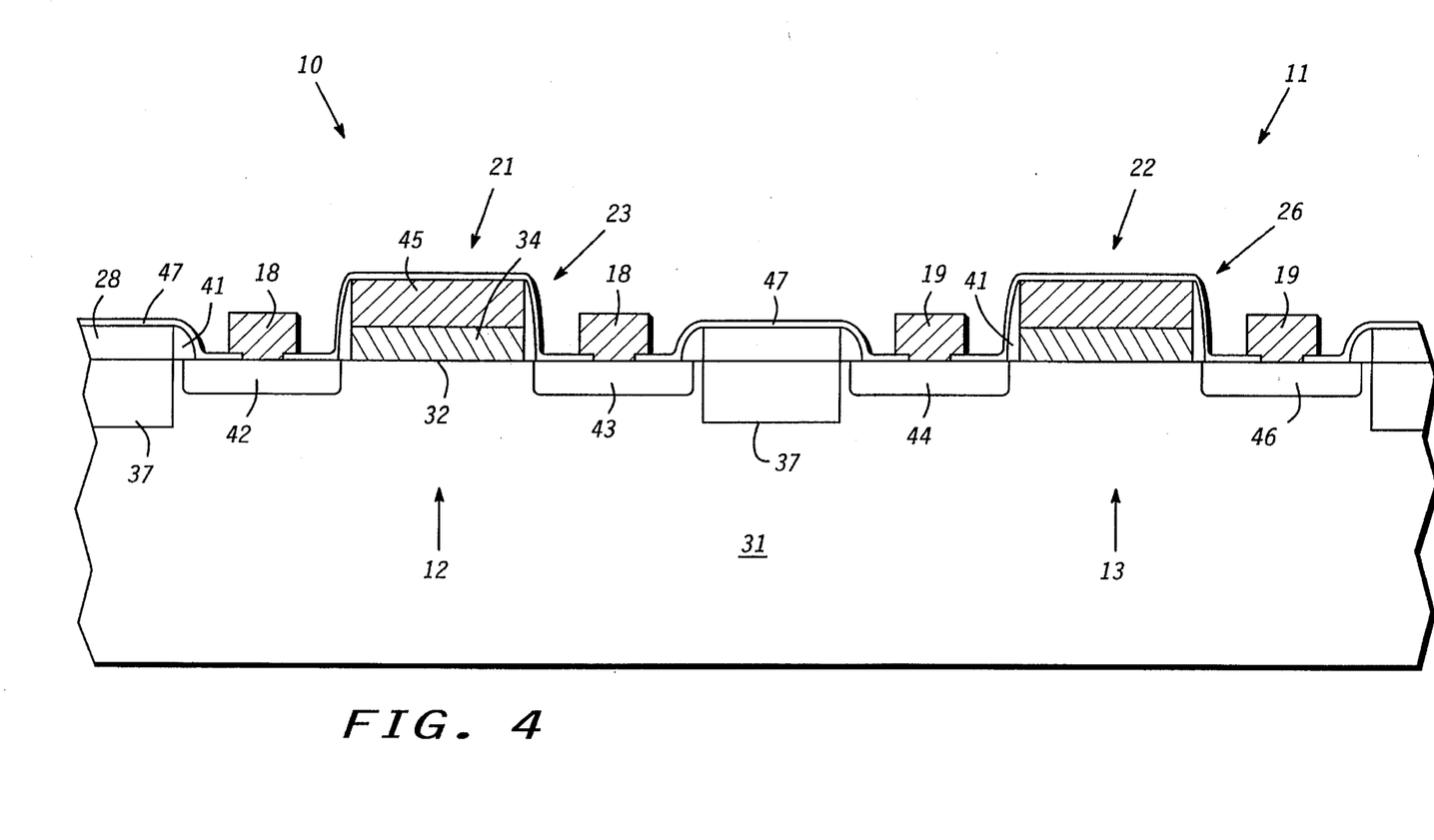

FIG. 4 illustrates a highly enlarged cross-sectional view of the portions of semiconductor devices 10 and 11 during a further processing step. A conductive layer 45 such as, for example, TiWN is deposited on the plurality of islands 34 and the field oxide 28. Conductive layer 45 and the plurality of islands 34 are patterned using lithographic and etch techniques well known to those skilled in the art to form control electrodes 21 and 22. More particularly, the plurality of islands 34 and portions of conductive layer 45 are patterned to form first portions 23 and 26 of control electrodes 21 and 22, respectively. In addition, conductive layer 45 is patterned to form second portions 24 and 27 of control electrodes 21 and 22, respectively, having first and second sides (FIG. 1). First portions 23 and 26 form gate electrodes for FET's 10 and 11, thus the regions of semiconductor substrate 31 below gate electrodes 23 and 26 serve as channel regions for the respective FET's 10 and 11. Preferably, gate electrodes 23 and 26 contact central portions of active device regions 12 and 13, respectively. However, it shall be understood that gate electrodes 23 and 26 may contact non-central portions of active device regions 12 and 13, i.e., gate electrodes 23 and 26 may be off-center in active device region 12 and 13, respectively.

A layer of insulating or dielectric material (not shown) such as, for example, silicon dioxide is deposited on gate electrodes 21 and 22, the portions of major surface 32 in active areas 12 and 13 between portions 23 and 26 of gate electrodes 21 and 22, respectively, and field oxide 28, respectively. Sidewall spacers 41 are formed adjacent portions 23 and 26 of gate electrodes 21 and 22, respectively, and adjacent field oxide regions 28 in active device regions 12 and 13 using a known anisotropic etch technique.

First, second, third, and fourth dopant regions 42, 43, 44, and 46, respectively, are formed using photolithographic and self-aligned implantation techniques known to those of skill in the art. More particularly, first dopant region 42 is formed on the first side of gate electrode 21 and second dopant region 43 is formed on the second side of gate electrode 21. Likewise, third dopant region 44 is formed on the first side of gate electrode 22 and fourth dopant region 46 is formed on the second side of gate electrode 22. Preferably, the distances of regions 42, 43, 44, and 46 into the compound semiconductor substrate from major surface 32 are substantially equal and are less than the distance of isolation regions 37 into compound semiconductor substrate 31 from major surface 32. For example, to form an N-channel FET 10, the impurity material of first and second dopant regions 42 and 43, respectively, is silicon, and to form a P-type FET, the impurity material of third and fourth dopant regions 44 and 46, respectively, is beryllium. Dopant regions 42 and 43 form source/drain regions and are illustrated as regions 16 in FIG. 1. Regions 44 and 46 also form source/drain regions and are illustrated as regions 17 in FIG. 1. In the first embodiment, FET's 10 and 11 are complementary compound semiconductor devices. Typically, the implants forming the source and drain regions are annealed at approximately 850° C. for approximately 6 seconds. An insulating layer 47 such as, for example, silicon dioxide is deposited on gate electrode structures 21 and 22, exposed portions of major surface 32, field oxide 28, and sidewall spacers 41. Using techniques well known in the art, contact openings are formed in layer of insulating material 47 to expose portions of major surface 32 of doped regions 42, 43, 44, and 46. Source and drain electrodes 18 and 19, respectively, are formed by depositing a layer of conductive material such as, for example, NiGeW on layer of insulating material 47 and in the contact openings. Using techniques well known to those skilled in the art, the layer of conductive material is patterned, leaving only source and drain electrodes 18 and 19, respectively, in contact with the respective device regions 12 and 13.

Figures 5, 6:
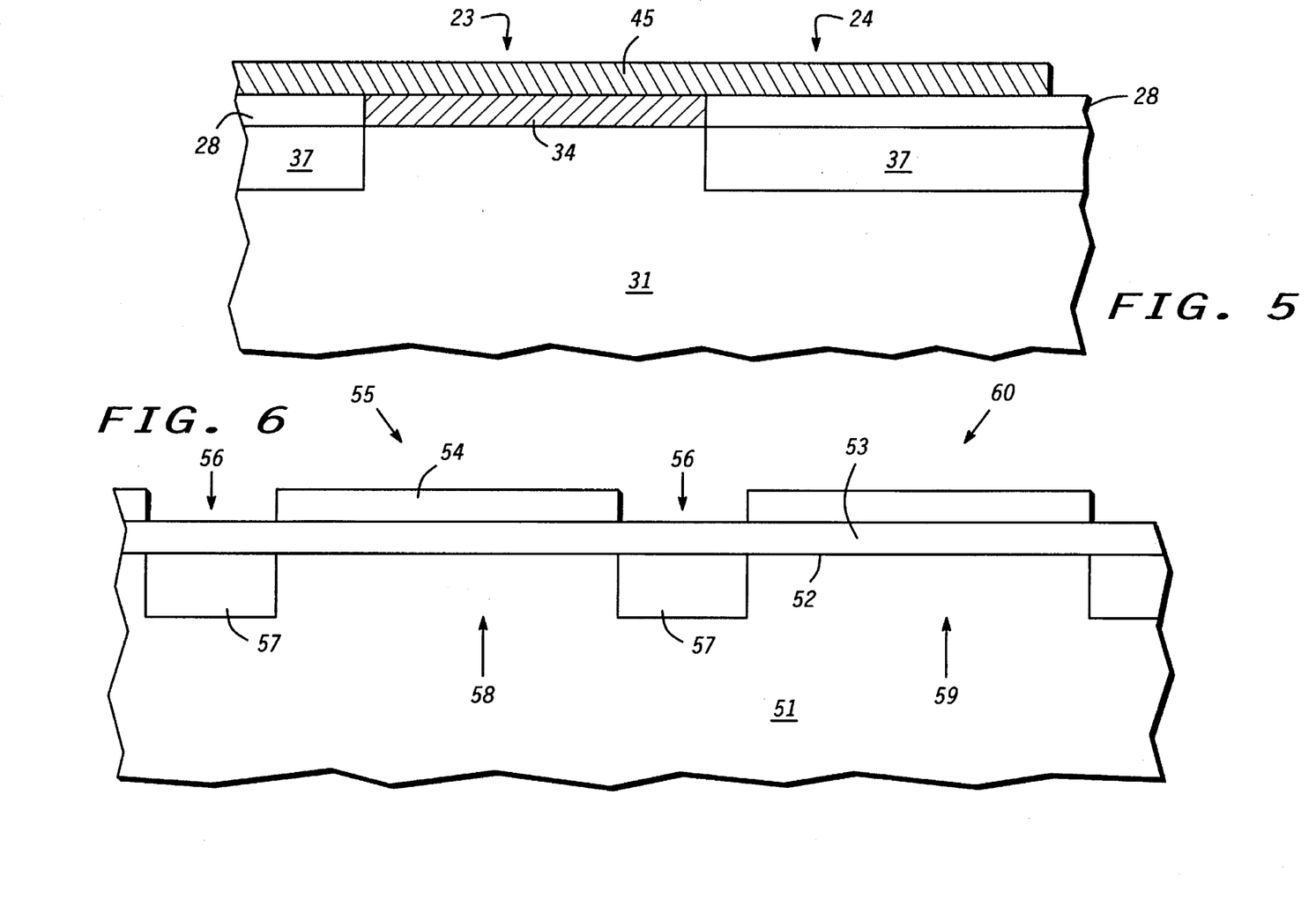
FIG. 5 illustrates a highly enlarged cross-sectional view of a portion of one semiconductor device taken along section line 5—5 of FIG. 1.
FIGS. 6–8 illustrate highly enlarged cross-sectional views of a plurality of semiconductor devices fabricated in accordance with a second embodiment of the present invention.

FIG. 5 illustrates a cross-sectional view of a portion of one semiconductor device taken along section line 5—5 of FIG. 1. More particularly, FIG. 5 illustrates first and second portions 23 and 24, respectively, of control electrode structure 21 (FIG. 1). Second portion 24 is an extension of first portion 23 wherein second portion 24 extends over field oxide 28 having isolation regions 37 therebelow. Second portion 24 may serve as a gate pad for a FET. It should be noted that second portion 24 is over field oxide regions that are themselves over isolation regions 37. Thus, the original doping of compound semiconductor substrate 31 (whether intentional or unintentional) is made non-conductive and second portion 24, i.e., a gate pad, is electrically isolated from substrate 31. As a result, a capacitance between second portion 24 and substrate 31 is reduced or eliminated thereby improving performance of the FET. In addition, the present invention affords isolating active areas of different semiconductor devices when a control electrode structure of one semiconductor device is connected to a control electrode structure of another semiconductor device.

FIG. 6 illustrates a highly enlarged cross-sectional view of portions of semiconductor devices 55 and 60 during a processing step in accordance with a second embodiment of the present invention. What is shown is a compound semiconductor substrate 51 having a major surface 52 covered by a surface protection layer 53 such as, for example, silicon dioxide. Preferably, surface protection layer 53 has a thickness of approximately 5000 angstroms. An implant block mask is formed on surface protection layer 53 and patterned into a plurality of islands 54 which serve as isolation implant block masks. By way of example, the plurality of islands are photoresist which are patterned using techniques well known to those skilled in the art. The plurality of islands 54 are separated by openings 56 which expose portions of surface protection layer 53. In accordance with the preferred embodiment, isolations regions 57 are formed by implanting oxygen ions (O$^+$) through openings 56 into regions of compound semiconductor substrate 51 in a three step process. In the first implant step, oxygen ions (O$^+$) are implanted at an energy of approximately 90 keV and a dose of approximately $2\times10^{14}$ ions/cm$^2$; in a second implant step, oxygen ions are implanted at an energy of approximately 180 KeV and a dose of approximately $2\times10^{14}$ ions/cm$^2$; and in a third implant step, oxygen ions are implanted at an energy of approximately 360 KeV and a dose of approximately $2\times10^{14}$ ions/cm$^2$. Although a dose of approximately $2\times10^{14}$ ions/cm$^2$ has been specified, it shall be understood that a suitable range of doses is between approximately $1\times10^{14}$ ions/cm$^2$ or $1\times10^{15}$ ions/cm$^2$. It shall be further understood that the regions of semiconductor substrate 51 between isolation regions 57 serve as semiconductor device regions 58 and 59. Accordingly, semiconductor device region 58 is shown between two adjacent isolation regions 57 and a second semiconductor device region 59 is shown between two isolation regions 57.

Figure 7:
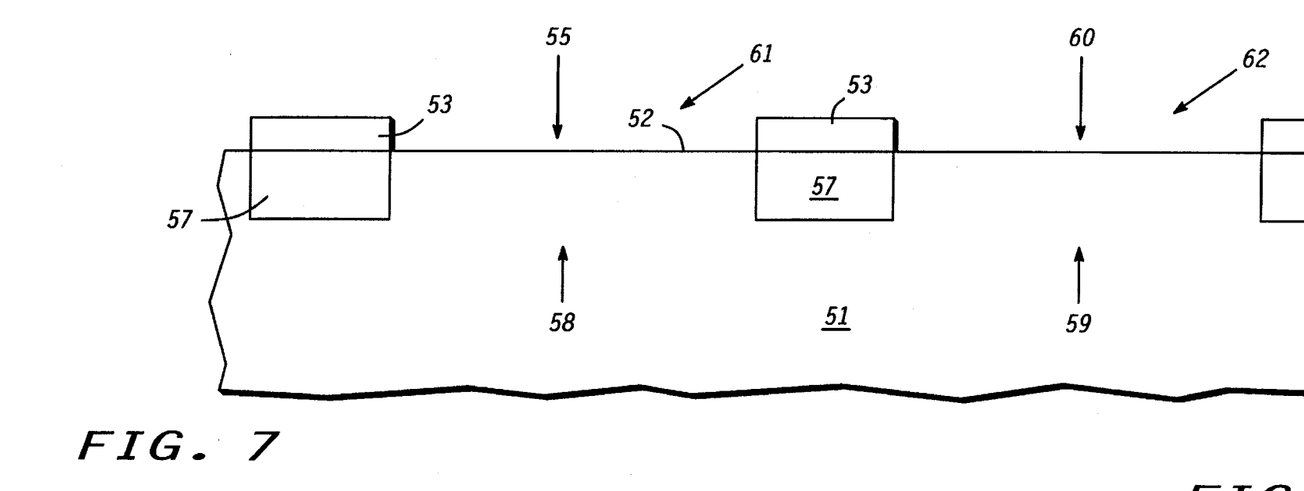

FIG. 7 illustrates a cross-sectional view of portions of semiconductor devices 55 and 60 during a further processing step in accordance with the second embodiment of the present invention. Isolation implant block masks 54 are removed from surface protection layer 53. Openings 61 and 62 are formed in surface protection layer 53, wherein openings 61 and 62 expose portions of major surface 52 in first and second semiconductor device regions 58 and 59, respectively. Portions of major surface 52 above isolation regions 57 remain covered by portions of surface protection layer 53.

Figure 8:
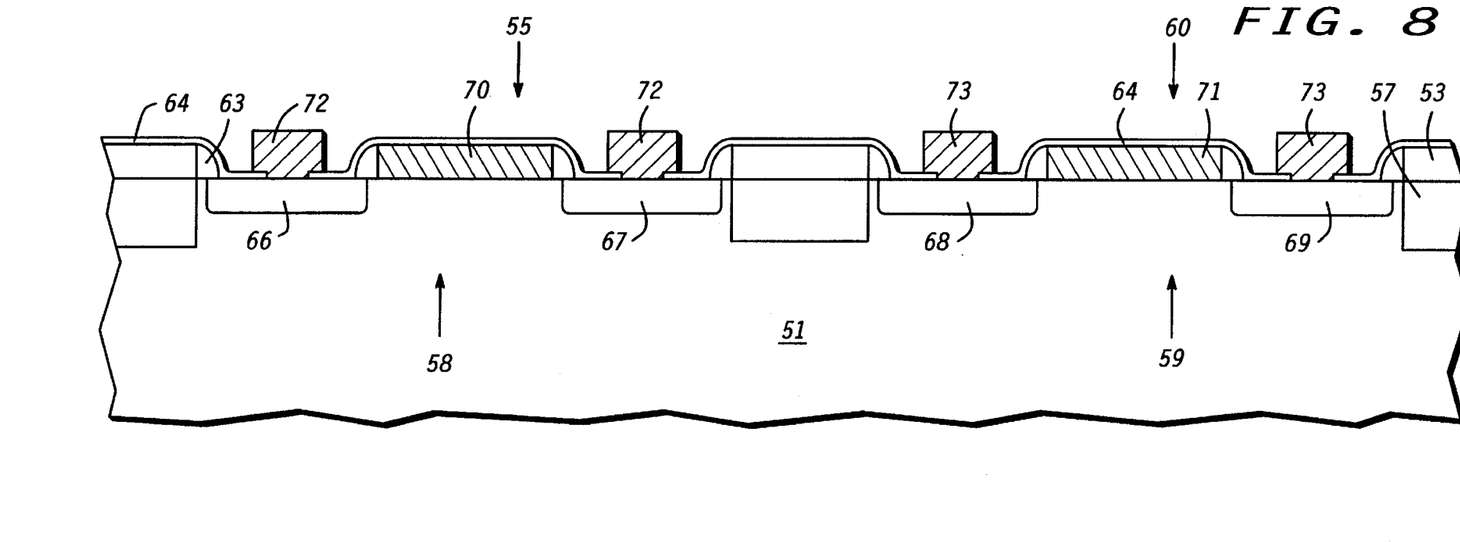

FIG. 8 illustrates a cross-sectional view of a portion of semiconductor devices 55 and 60 in yet a further process step in accordance with the second embodiment of the present invention. A control electrode material such as, for example, TiWN is deposited on the exposed portions of major surface 52 and on the remaining portions of surface protection layer 53, thereby filling openings 61 and 62. The control electrode material is etched to form gate electrodes 70 and 71. Although not shown, it shall be understood that gate electrodes 70 and 71 extend over a portion of surface protection layer 53. Accordingly, gate electrodes 70 and 71 form a gate electrode structure having a first portion in contact with major surface 52 and a second portion (not shown) extending over surface protection layer 53, wherein the first and second portions of gate electrodes 70 and 71 are analogous to first and second portions 23 and 24, respectively, of control electrode 21 and first and second portions 26 and 27, respectively, of control electrode 22 as shown in FIG. 1.

A layer of insulating material (not shown) such as, for example, silicon dioxide is deposited on gate electrodes 70 and 71, the exposed portions of major surface 52 in semiconductor device regions 58 and 59, and on surface protection layer 53. Sidewall spacers 63 are formed using an anisotropic etch technique well known to those skilled in the art.

First, second, third, and fourth dopant regions 66, 67, 68, and 69, respectively, are formed using photolithographic and self-aligned implantation techniques known to those of skill in the art. For example, to form an N-channel FET, the impurity material of first and second dopant regions 66 and 67, respectively, is silicon, and to form a P-channel FET, the impurity material of third and fourth dopant regions 68 and 69, respectively, is beryllium. Dopant regions 66 and 67 form source/drain regions which are analogous to regions 16 in FIG. 1 and dopant regions 68 and 69 form source/drain regions which are analogous to regions 17 in FIG. 1. Typically, the implants forming the source and drain regions are annealed at approximately 850° C. for approximately 6 seconds.

An insulating layer 64 such as, for example, silicon dioxide is deposited on gate electrodes 70 and 71, exposed portions of major surface 52, the remaining portions of surface protection layer 53, and sidewall spacers 63. Contact openings are formed in layer of insulating material 64 to expose portions of major surface 52 of doped regions 66, 67, 68, and 69 using techniques well known to those skilled in the art. Source/drain electrodes 72 and source/drain electrodes 73 are formed by depositing a layer of conductive material such as, for example, NiGeW on layer of insulating material 64 and in the contact openings. Using techniques well known to those skilled in the art, the layer of conductive material is patterned, leaving only source and drain electrodes 72 and 73, respectively, in contact with the respective device regions 58 and 59.

Figure 9:
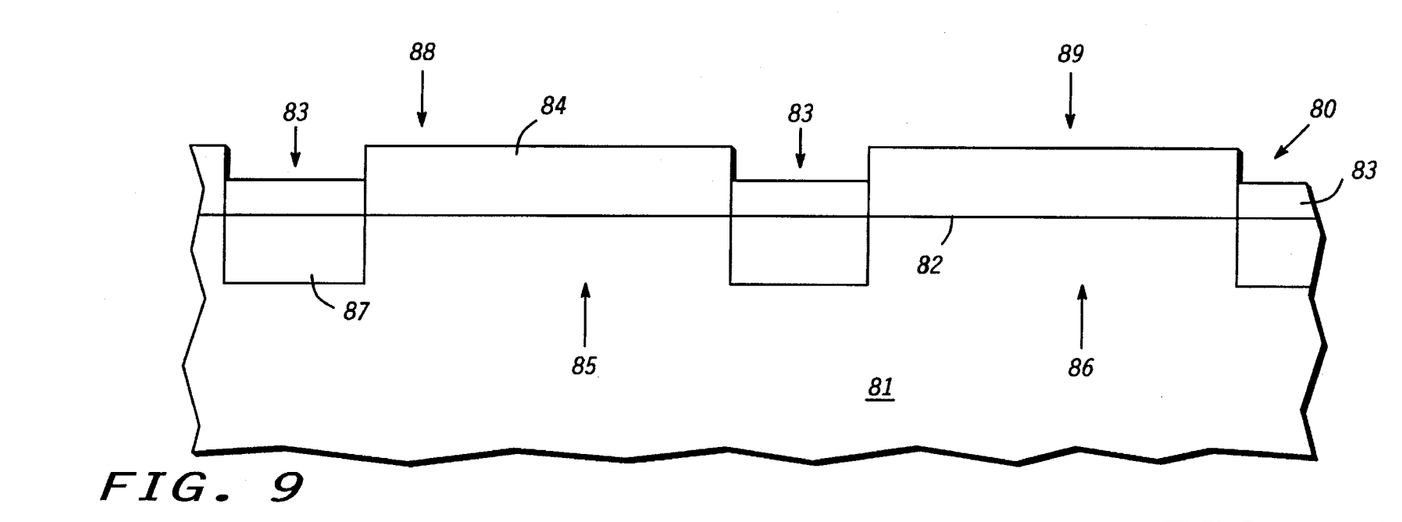
FIGS. 9–10 illustrate highly enlarged cross-sectional views of a plurality of semiconductor devices fabricated in accordance with a third embodiment of the present invention.

FIG. 9 illustrates a cross-sectional view of portions of semiconductor devices 88 and 89 during a processing step in accordance with a third embodiment of the present invention. FIG. 9 shows a compound semiconductor substrate 81 having a major surface 82. A layer of dielectric material 83 is formed on major surface 82 and serves as a surface protection layer. Layer of dielectric material 83 is patterned using techniques well known in the art to form a plurality of openings (not shown) in layer of dielectric material 83 which expose portions of major surface 82. By way of example, layer of dielectric material 83 is silicon dioxide. More particularly, the openings expose first and second semiconductor device regions 85 and 86, respectively. An isolation implant block mask 84 such as, for example, photoresist is formed in the openings and covers the remaining portions of layer of dielectric material 83. Implant openings 80 are formed in the isolation implant block mask 84 to uncover the remaining portions of layer of dielectric material 83. In accordance with the preferred embodiment, isolation regions 87 are formed by implanting oxygen ions ($O^+$) through implant openings 80 into regions of compound semiconductor substrate 81 in a three step process. In the first implant step, oxygen ions ($O^+$) are implanted at an energy of approximately 90 keV and a dose of approximately $2\times10^{14}$ ions/cm$^2$, in a second implant step oxygen ions are implanted at an energy of approximately 180 KeV and a dose of approximately $2\times10^{14}$ ions/cm$^2$ and in a third implant step oxygen ions are implanted at an energy of approximately 360 KeV and a dose of approximately $2\times10^{14}$ ions/cm$^2$. Although a dose of approximately $2\times10^{14}$ ions/cm$^2$ has been specified, it shall be understood that a suitable range of doses is between approximately $1\times10^{14}$ ions/cm$^2$ or $1\times10^{15}$ ions/cm$^2$. It shall be further understood that the regions of semiconductor substrate 81 between isolation regions 87 serve as semiconductor device regions 85 and 86. Accordingly, first semiconductor device region 85 is shown between two adjacent isolation regions 87 and second semiconductor device region 86 is shown between two isolation regions 87. The isolation implant block mask 84 is removed, exposing major surface 82 in first and second semiconductor device regions 85 and 86, respectively.

Figure 10:
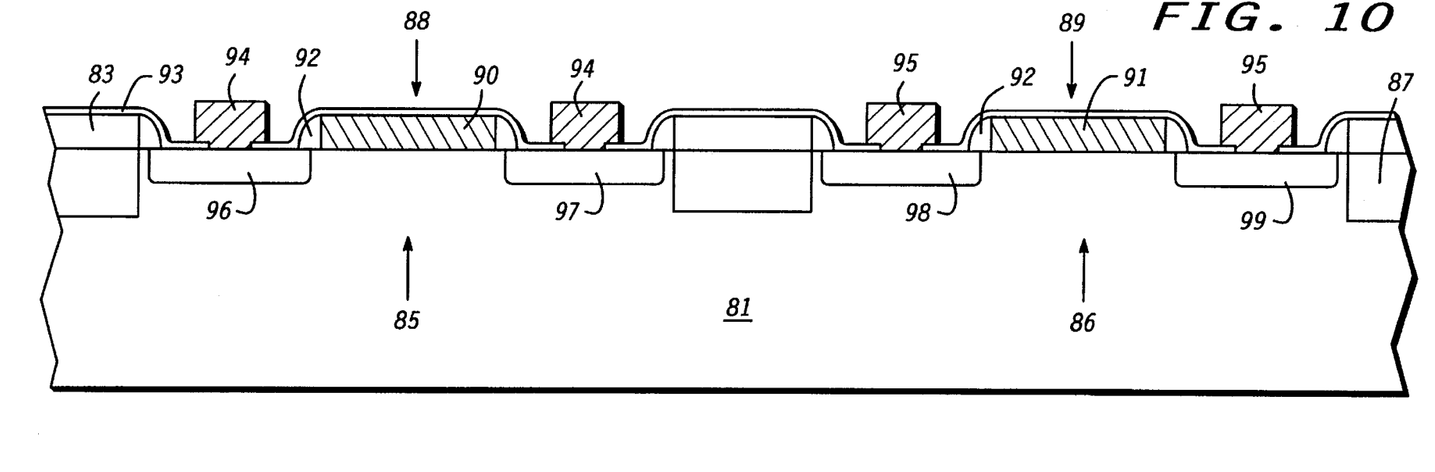

FIG. 10 illustrates a cross-sectional view of the portions of semiconductor devices 88 and 89 further along in processing. A gate electrode material such as, for example, TiWN is deposited on the exposed portions of major surface 82 and on the remaining portions of surface protection layer 83. The gate electrode material is etched to form gate electrodes 90 and 91. Although not shown, it shall be understood that gate electrodes 90 and 91 extend over a portion of surface protection layer 83. Accordingly, gate electrodes 90 and 91 form gate electrode structures having first portions in contact with major surface 82 and second portions (not shown) extending over the remaining portions of surface protection layer 83, wherein the first and second portions of gate electrodes 90 and 91 are analogous to first and second portions 23 and 24, respectively, of control electrode 21 and first and second portions 26 and 27, respectively, of control electrode 22 as shown in FIG. 1.

A layer of insulating material (not shown) such as, for example, silicon dioxide is deposited on gate electrodes 90 and 91, the exposed portions of major surface 82 in semiconductor device regions 85 and 86, and on surface protection layer 83. Sidewall spacers 92 are formed using an anisotropic etch technique well known to those skilled in the art.

First, second, third, and fourth dopant regions 96, 97, 98, and 99, respectively, are formed using photolithographic and self-aligned implantation techniques known to those of skill in the art. For example, to form an N-type FET 88, the impurity material of first and second dopant regions 96 and 97, respectively, is silicon, and to form a P-type FET 89, the impurity material of third and fourth dopant regions 98 and 99, respectively, is beryllium. Dopant regions 96 and 97 form source/drain regions of FET 88 and are analogous to regions 16 in FIG. 1. Regions 98 and 99 form source/drain regions of FET 89 and are analogous to regions 17 in FIG. 1. Typically, the implants forming the source and drain regions are annealed at approximately 850° C. for approximately 6 seconds.

An insulating layer 93 such as, for example, silicon dioxide is deposited on gate electrodes 90 and 91, exposed portions of major surface 82, surface protection layer 83, and sidewall spacers 92. Contact openings are formed in layer of insulating material 93 to expose portions of major surface 82 of doped regions 96, 97, 98, and 99 using techniques well known to those skilled in the art. Source/drain electrodes 94 and source/drain electrodes 95 are formed by depositing a layer of conductive material (not shown) such as, for example, NiGeW on layer of insulating material 93 and in the contact openings. Using techniques well known to those skilled in the art, the layer of conductive material is patterned, leaving only source/drain electrodes 94 in first semiconductor device region 85 and source/drain electrodes 95 in second semiconductor device region 86.

By now it should be appreciated that a method for forming isolation regions within a compound semiconductor substrate and a compound semiconductor device having the isolation regions has been provided. In the present invention, the original compound semiconductor substrate doping (whether intentional or unintentional) is made non-conductive by an ion implant, thereby forming isolation regions and isolating the gate pad from the compound semiconductor substrate. Accordingly, the gate pad to substrate capacitance is reduced. In addition, the active areas or regions of different compound semiconductor devices are isolated, one from another. Thus, control or gate electrode material may be used to interconnect many devices over a longer distance, allowing additional reduction of chip size and a higher device integration level with improved device performance. Also, the source/drain implant and the isolation implant anneal may be performed in a single step because the isolation is able to withstand the source/drain anneal temperature, without sacrificing the integrity of the isolation.

I claim:

1. A method for forming an isolation region in a compound semiconductor substrate, comprising the steps of:

providing the compound semiconductor substrate having a major surface;

covering a portion of the major surface with a surface protection material by depositing a layer of metal on the major surface, the layer of metal serving as the surface protection material;

forming the isolation region in the compound semiconductor substrate, the isolation region surrounding an active region of the compound semiconductor substrate and extending from the major surface into the compound semiconductor substrate a first distance, wherein the step of forming the isolation region further includes the steps of:

patterning the layer of metal to form at least one metal island, the region of the compound semiconductor substrate below the at least one metal island serving as the active region of the compound semiconductor substrate;

forming an insulating material on the major surface, the insulating material surrounding the at least one metal island;

forming an isolation implant block mask on the layer of metal; and implanting an impurity material through the insulating material on the major surface into a portion of the compound semiconductor substrate, the regions containing the impurity material serving as the isolation region;

forming a control electrode in contact with a first portion of the active region after the step of forming the isolation region, the control electrode having first and second sides;

forming a first dopant region in a second portion of the active region and a second dopant region in a third portion of the active region, the first dopant region adjacent the first side of the control electrode and the second dopant region adjacent the second side of the control electrode; and contacting a portion of the first dopant region with a first electrode and a portion of the second dopant region with a second electrode.

2. The method of claim 1, further including forming the control electrode in a central portion of the active region.

3. The method of claim 1, further including forming the control electrode in a non-central portion of the active region.

4. The method of claim 1, wherein the step of forming the isolation region in the compound semiconductor substrate includes three implant steps comprising:

implanting oxygen ions into non-active regions of the compound semiconductor substrate at an implant energy of approximately 90 kilo-electron volts and a dose of approximately $2 \times 10^{14}$ ions/cm$^2$ in a first implant step;

implanting oxygen ions into the non-active regions of the compound semiconductor substrate at an implant energy of approximately 180 kilo-electron volts and a dose of approximately $2 \times 10^{14}$ ions/cm$^2$ in a second implant step; and implanting oxygen ions into the non-active regions of the compound semiconductor substrate at an implant energy of approximately 360 kilo-electron volts and a dose of approximately $2 \times 10^{14}$ ions/cm$^2$ in a third implant step.

5. The method of claim 1, wherein the step of forming the isolation region in the compound semiconductor substrate comprises implanting an ion selected from the group consisting of oxygen, boron, aluminum, nitrogen, and carbon into a portion of the compound semiconductor substrate.

6. A method of forming an isolation structure in a III-V semiconductor substrate, comprising the steps of:

providing the III-V semiconductor substrate having a major surface;

forming the isolation structure adjacent at least one active region, wherein the step of forming the isolation structure further includes the steps of:

forming a layer of dielectric material on the major surface;

forming at least one opening in the layer of dielectric material, the at least one opening exposing the major surface of the at least one active device region;

forming an implant block mask in the at least one opening; and implanting an impurity material into a region of the III-V semiconductor substrate adjacent the at least one active device region, the impurity material forming the isolation region;

forming a gate electrode in contact with a portion of the least one active device region, the step of forming the gate electrode being performed after the step of forming the isolation structure;

forming a source region in the at least one active device region on one side of the gate electrode and a drain region in the at least one active device region on another side of the gate electrode; and forming a source electrode in contact with the source region and a drain electrode in contact with the drain region.

7. The method of claim 6, wherein the step of implanting an impurity material into a region of the III-V semiconductor substrate adjacent the at least one active device region comprises implanting an ion selected from the group consisting of oxygen, boron, aluminum, nitrogen, and carbon into a portion of the compound semiconductor substrate.

8. The method of claim 6, wherein the step of forming a gate electrode in contact with a portion of the at least one active device region further includes forming a portion of the gate electrode over a portion of the isolation structure, wherein a dielectric material is between the portion of the gate electrode and a portion of the isolation structure.

9. The method of claim 6, further including performing a single anneal to anneal the isolation structure, the source region, and the drain region.

10. The method of claim 6, wherein the step of implanting an impurity material into a region of the III-V semiconductor substrate adjacent the at least one active region includes three implant steps comprising:

implanting oxygen ions into non-active regions of the compound semiconductor substrate at an implant energy of approximately 90 kilo-electron volts and a dose of approximately $2 \times 10^{14}$ ions/cm$^2$ in a first implant step;

implanting oxygen ions into the non-active regions of the compound semiconductor substrate at an implant energy of approximately 180 kilo-electron volts and a dose of approximately $2 \times 10^{14}$ ions/cm$^2$ in a second implant step; and implanting oxygen ions into the non-active regions of the compound semiconductor substrate at an implant energy of approximately 360 kilo-electron volts and a dose of approximately $2 \times 10^{14}$ ions/cm$^2$ in a third implant step.

* * * * *